(12) United States Patent
Subramanian et al.

(10) Patent No.: US 7,212,033 B2
(45) Date of Patent: May 1, 2007

(54) HIGH SPEED TRANSIENT IMMUNE DIFFERENTIAL LEVEL SHIFTING DEVICE

(75) Inventors: Muthu Subramanian, Redondo Beach, CA (US); Ravindran Mohanavelu, Folsom, CA (US)

(73) Assignee: International Rectifier Corporation, El Segundo, CA (US)

( * ) Notice: Subject to any disclaimer, the term of this patent is extended or adjusted under 35 U.S.C. 154(b) by 90 days.

(21) Appl. No.: 11/090,539

(22) Filed: Mar. 25, 2005

(65) Prior Publication Data

US 2005/0229120 A1 Oct. 13, 2005

Related U.S. Application Data

(60) Provisional application No. 60/557,052, filed on Mar. 26, 2004.

(51) Int. Cl.
*H03K 19/0175* (2006.01)
(52) U.S. Cl. .......................................... 326/68; 326/86
(58) Field of Classification Search .................. 326/68, 326/80–83, 86; 327/333
See application file for complete search history.

(56) References Cited

U.S. PATENT DOCUMENTS 5,313,121 A * 5/1994 Cianci et al. ............... 327/103
6,933,765 B2 * 8/2005 Kanno et al. ............... 327/333
7,046,037 B1 * 5/2006 Tyhach et al. ................ 326/80

* cited by examiner

*Primary Examiner*—James H. Cho
(74) *Attorney, Agent, or Firm*—Ostrolenk, Faber, Gerb & Soffen, LLP

(57) ABSTRACT

A level shifting device having an input side operating at a first voltage level, an output side operating at a second voltage level and a level shifting circuit which connects the input and output sides. The input circuit receives an input signal referenced to the first voltage level and provides separate outputs corresponding to transitions of the input signal. The level shifting circuit includes MOSFETS having the gates connected respectively to each output of the input circuit; and the source-drain path coupled between the second voltage and a reference for the first voltage. The output side has a differential topology, and includes a first circuit which samples signals corresponding to the transitions of the input signal, holds the sample between transitions, and an output circuit which receives the held sample signal in differential form and converts it to single-ended form for use by other circuits. The circuit also blocks input signals when common mode transients are present. The device is realized as an integrated circuit using exclusively n-channel MOSFETS in the critical path of operation.

14 Claims, 3 Drawing Sheets

HIGH SPEED TRANSIENT IMMUNE DIFFERENTIAL LEVEL SHIFTING DEVICE

CROSS-REFERENCE TO RELATED APPLICATIONS

This application is based on and claims priority to U.S. Provisional Application Ser. No. 60/557,052, filed Mar. 26,2004, the entire disclosure of which is incorporated herein by reference.

BACKGROUND OF THE INVENTION

1. Technical Field of the Invention

The present invention relates to level shifting devices, and more particularly, to level shifting devices which operate at high frequencies, e.g., up to about 2 MHz, and exhibit low power dissipation and good immunity to transient (i.e., common mode) voltages.

2. Relevant Art

Level shifters are basically interface buffers that couple signals referenced to a first signal level into circuits referenced to a completely separate and different second signal level. For example, portions of an integrated circuit (IC) logic device may be connected between a supply voltage $V_{SUPP}$ and a common signal level COM, but the output of the IC must drive another device connected between a power voltage $V_{PWR}$ and a ground GND. Examples of such applications include half-bridge and full-bridge high voltage topologies used in motor drives, lighting ballasts, class-D audio amplifiers and other floating well system topologies.

In some applications, such as class-D amplifiers and plasma panel displays, the level shifter must operate at high frequencies (e.g., up to about 2 MHz) with minimum propagation delays, and must be immune to false operation by common mode transients due to the high switching speeds. And always, with ICS, low power dissipation is an important consideration.

Numerous circuit designs have been proposed to satisfy these requirements, but all are deficient to a greater or lesser degree in one or more respects. Thus a need still exists for a level shifter circuit design which better meets these requirements.

SUMMARY OF THE INVENTION

The present invention seeks to meet the above-described need by using only NMOS devices in the critical path of operation and by employment of fully differential circuit topology, and intelligent common mode transient sensing.

According to one aspect of the invention, a level shifting device is provided having an input side, an output side, and a level shifting circuit connecting the input side and the output side. The input side comprises an input circuit operating at a first voltage and the output side operates at a second voltage provided by separate and independent supply and reference buses. The input circuit receives an input signal referenced to the first voltage, and to provide an of output to the level shifting circuit. The output side includes a first circuit having fully differential topology; and an output circuit which receives a fully differential input from the first circuit and provides a single-ended output referenced to the second voltage.

Further according to the first aspect of the invention, there is provided a circuit which responds to a common mode transient to hold the output signal at its then current level until the transient passes, but permits the output to return to a rest level when the input signal returns to the second level.

According to a second aspect of the invention, the output of the input circuit is comprised of a first signal corresponding to a transition of the input signal from a first level to a second level, a second signal corresponding to a transition of the input signal from the second level to the first level, and a third signal corresponding to each transition of the input signal.

According to a third aspect of the invention, the level shifting circuit is comprised of a plurality of switches, each having a signal path and a control terminal, wherein the output signals from the input circuit are respectively connected to a control terminal of one of the switches, and the signal paths of the switches are connected between the first reference bus and the second supply bus.

According to a fourth aspect of the invention, the output side is operative to sample signals corresponding to transitions of the input signals between first and second signal levels, to hold signals corresponding the values of the sampled signals between transitions, and to supply the held values in differential form to an output circuit which converts the differential signal into single-ended form.

Further according to the fourth aspect of the invention, the output side includes a latch circuit having first and second complementary outputs which is operative to hold signals corresponding the sampled values between transitions, and to supply the outputs thereof as inputs to a differential to single-ended conversion circuit.

According to a fifth aspect of the invention, the level shifting circuit is comprised of a plurality of n-channel MOSFETS.

According to a sixth aspect of the invention, the level shifting device is realized as an integrated circuit chip.

It is accordingly an object of this invention to provide a level shifting device which can operate at high frequencies, and exhibits low power dissipation and immunity to common mode transients.

Other features and advantages of the present invention will become apparent from the following description of the invention which refers to the accompanying drawings.

DETAILED DESCRIPTION OF THE INVENTION

Figure 1:
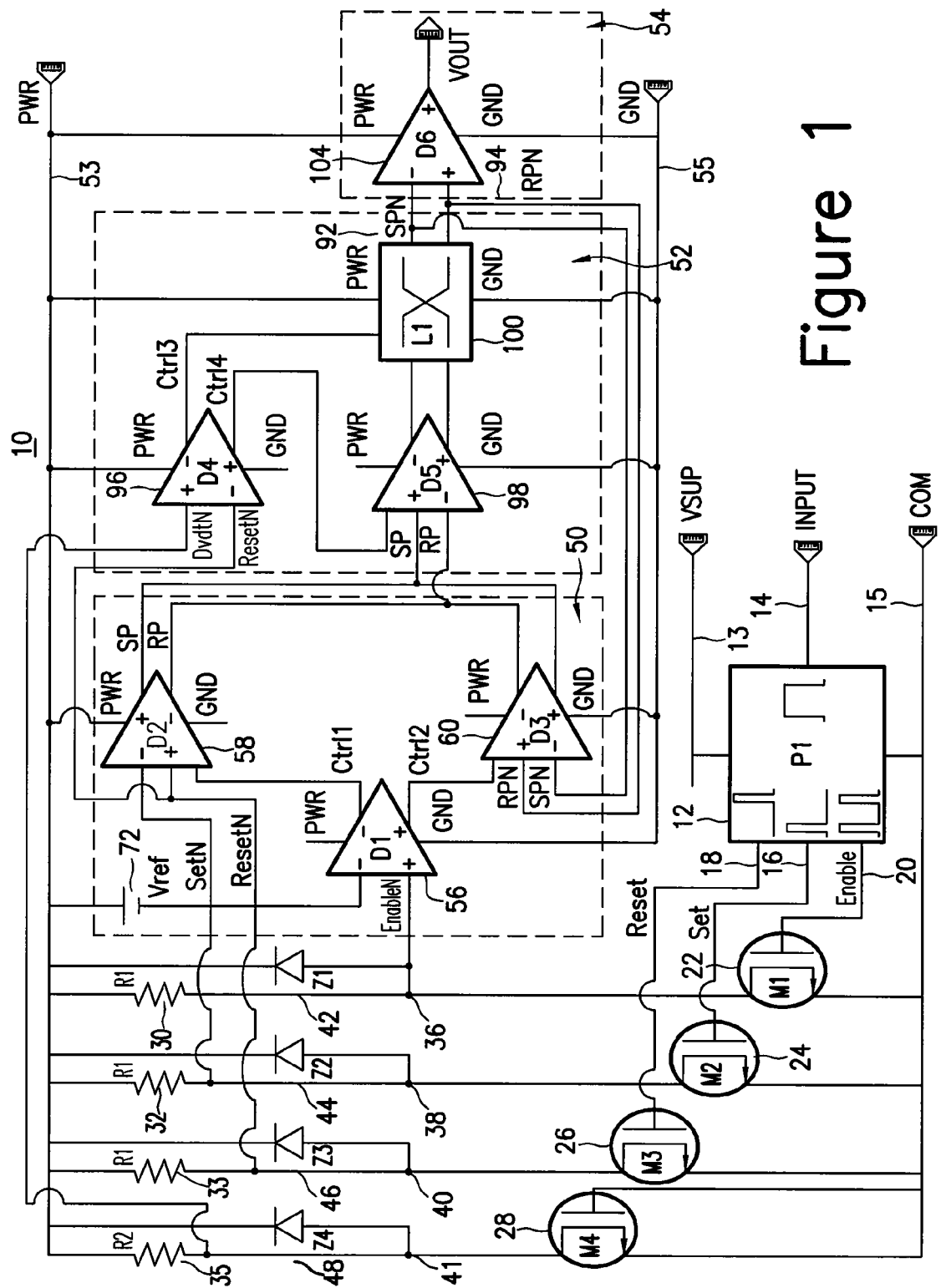
FIG. 1 is an overall block diagram of the circuit topology of the invention.

Referring first to FIG. 1, level shifter 10 according to the present invention converts an input signal referenced between voltages $V_{SUP}$ and COM (the "low side" or LS) and provides an output referenced between voltages $V_{PWR}$ and a ground GND (the "high side" or HS). The input or low side of level shifter 10 is comprised of an input circuit 12 connected between $V_{SUP}$ and COM buses 13 and 15. Input circuit 12 has an INPUT terminal 14 which receives the input pulse referenced between $V_{SUP}$ and COM, and provides edge triggered pulses at three outputs 16, 18 and 20 respectively. These are connected to the gate terminals of three level shifting transistors 22, 24, and 26. Diodes 42–46 connected in parallel with respective resistors 30, 32, and 33 between $V_{PWR}$ bus 53 and the drain terminal nodes 36–40 of the transistors clamp the voltage at these nodes with respect to $V_{PWR}$ to prevent device breakdown due to excessive voltages.

A fourth transistor 28 has its gate and source terminals connected to COM bus 15 and its drain terminal connected to $V_{PWR}$ bus 53 by resistor 35 and parallel diode 48. This is used as a common mode transient sensing transistor. The sensed information is then intelligently processed to hold the output of the IC in a safe state during common mode transients, as described more fully below.

Input circuit 12 is a logic circuit of any suitable or desired design which responds to the rising edge of the input pulse at terminal 14 to provide SET and ENABLE pulses at respective output terminals 18 and 20. Input circuit 12 also responds to the falling edge of the input pulse to provide RESET and ENABLE pulses at respective output terminals 18 and 20. In other words, the leading edge of the input pulse produces the SET pulses, the trailing edge produces the RESET pulse, and both edges produce ENABLE pulses.

The output pulses from input circuit 12 drive the respective level shifting transistors 22, 24, and 26 into conduction, which in turn, pulls down respective source terminal nodes 36, 38, and 40. These provide ENABLE N, SET N, and RESET N signals respectively. Diodes 42–48 clamp the voltage at ENABLE N, SET N, and RESET N nodes 36–40 with respect to $V_{PWR}$ to prevent device breakdown due to excessive voltages, as previously noted.

The high side functions of level shifter 10 are provided by a multiplexer unit 50, a discriminator latch unit 52, and a differential to single ended conversion unit 54. All of these units are connected between $V_{PWR}$ and GND buses 53 and 55. The operation of each of these units will be discussed below.

Multiplexer unit 50 is comprised of three fully differential circuits 56–60. The outputs "Ctrl1" and "Ctrl2" of circuit 56 are complementary signals, which control circuits 58 and 60.

Figure 2:
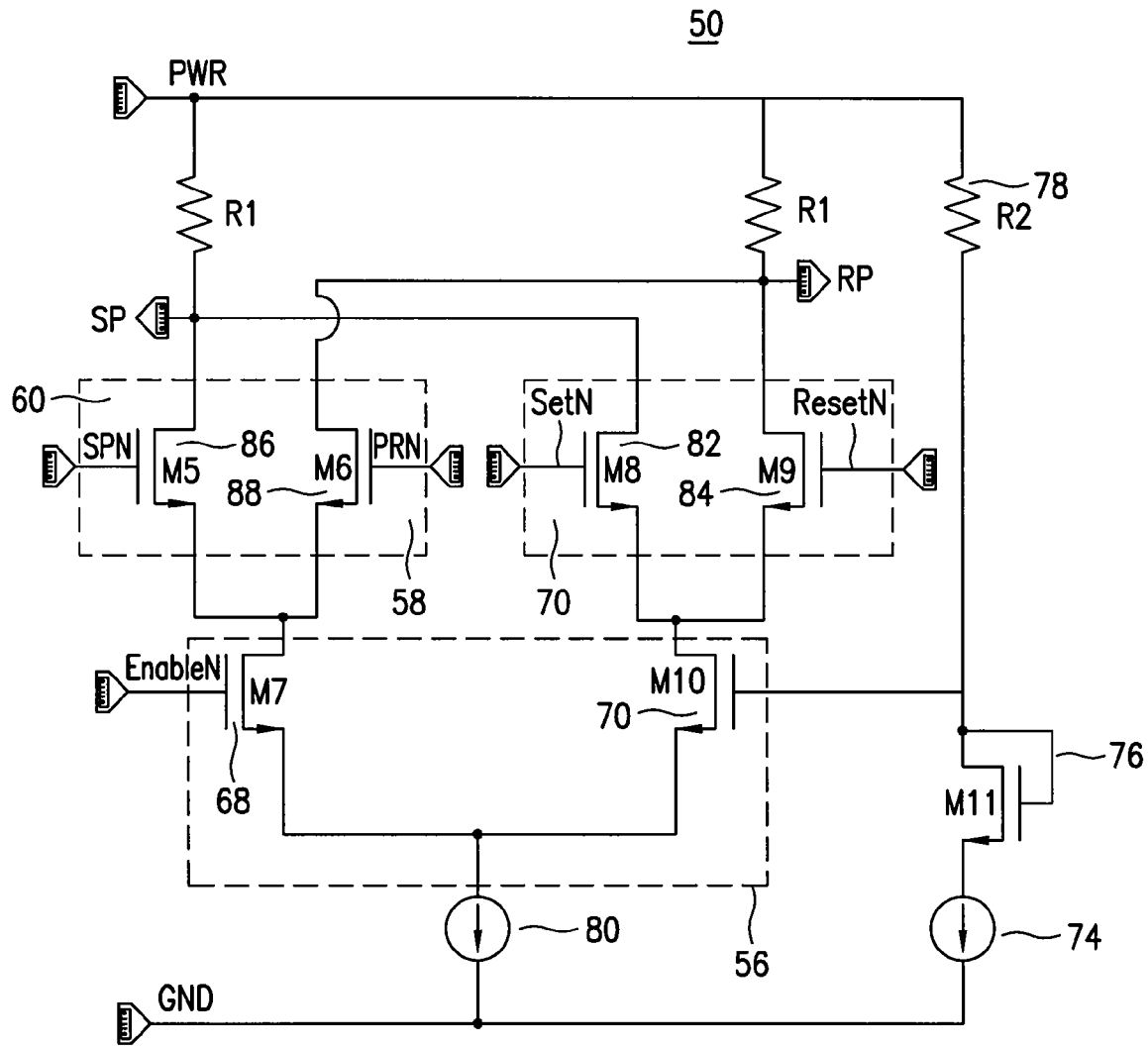
FIG. 2 illustrates the transistor level implementation of the multiplexer circuit of FIG. 1.

FIG. 2 shows one suitable implementation of multiplexer unit 50, but any other suitable implementation using fully differential topology and NMOS transistors may be used within the scope of the invention. Circuit 56 is comprised of transistors 68 and 70, the gates of which are driven by the ENABLE N signal at node 36 and by a reference voltage source 72 (see FIG. 1). As shown in FIG. 2, this is represented by an ideal current source 74 generated on chip which feeds a transistor 76 in series with a resistor 78. The bias current (shown in FIG. 2 as an ideal current source 80) is also generated on-chip. Due to the increased mobility of electrons vs. holes, N-channel MOS devices operate faster than P-channel devices. Hence, the circuit is realized using predominantly NMOS devices. Still referring to FIG. 2, circuit 58 is implemented by a pair of transistors 82 and 84, while circuit 60 is implemented by a pair of transistors 86 and 88.

As shown in FIG. 1, the voltage at "EnableN" node 36 controls the flow of current through transistor M7 and M10, which in turn control the outputs SP and RP.

The control logic is as follows; When EnableN is less than (PWR−Vref), the Ctrl1 output of circuit 56 is high, and circuit 58 is activated, while the Ctrl2 output of circuit 56 is low, and circuit 60 is de-activated. Activating circuit 56 implies that the SetN and ResetN nodes 38 and 40 (which correspond to the input pulse) are sampled. Hence, this corresponds to an input sampling state.

When "EnableN" is greater than (PWR−Vref), Ctrl2 output is high and circuit 60 is activated, while the Ctrl1 output is low, and circuit 58 is de-activated. Activating circuit 60 implies that the SPN and RPN (the output of the nodes 92 and 94 discriminator latch unit 52) are sampled. This corresponds to a HOLD state, as the level shift circuit holds the previous state established by the discriminator latch circuit.

The "SP" and "RP" signals are the outputs of the Multiplexer unit 50, and depending on which block is activated by the control logic of circuit 56, they respond to the respective inputs that are applied to the circuits 58 and 60.

The discriminator latch circuit 52 consists of two fully differential circuits 96 and 98 and a latch circuit 100. The outputs Ctrl3 and Ctrl4 of circuit 96 are complementary signals, which control circuits 98 and 100.

Figure 3:
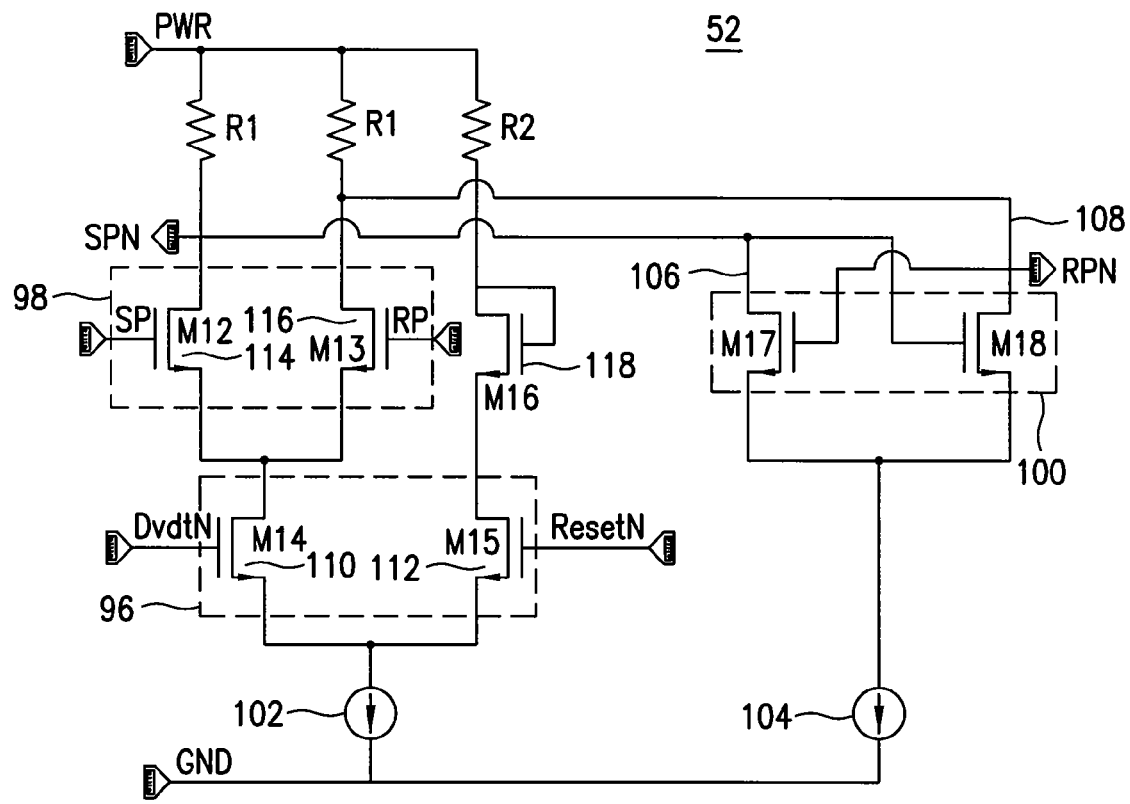
FIG. 3 illustrates the transistor level implementation of the discriminator latch circuit of FIG. 1.

FIG. 3 shows one preferred implementation of circuits 96–100 from FIG. 1, but other implementations using fully differential topology and NMOS transistors are also within the scope of the invention. The ideal current sources 102 and 104 are generated on-chip from a reference current block (not shown). Latch circuit 100 is formed by transistors 106 and 108, while circuit 96 is formed by transistors 110 and 112, and circuit 98 is formed by transistors 114 and 116.

The control logic is as follows:

When there is no significant common mode transient signal, transistor 28 if off, and the DvdtN signal at node 41 (see FIG. 1) is greater than the ResetN signal at node 46. In that case, the Ctrl3 output signal of circuit 96 is high, and circuits 98 is activated. Activating circuit 98 implies that the SP and RP outputs of circuits 58 and 60 respectively (which correspond to the input pulse), are sampled. Hence, this also corresponds to an input sampling state.

When there is a common mode transient the DvdtN signal at node 41 is less than the ResetN signal, the Ctrl3 output signal is high, and circuit 100 activated. At the same time, the Ctrl4 output signal is low, and circuit 98 is de-activated. Activating latch circuit 100 implies that the output nodes SPN and RPN of the latch are unchanged from the previous state, hence this corresponds to a HOLD state.

The nodes "SPN" and "RPN" are the outputs of the discriminator latch circuit 52, and depending on which circuit is activated by the control logic of circuit 96 they are either in the INPUT sampling state (responding to the "Set" and "Reset" signal) or in the HOLD state. Since a low dv/dtN signal indicates the presence of a common mode transient, latch circuit 100 is prevented from responding to the SET signal, and it remains inactive as long as the transient is present. If latch 100 is active when the transient is commenced, it will remain active until reset. As long as the transient remains, circuits 96 and 98 will not respond to a SET signal, and latch 100 will remain inactive.

Differential to single ended conversion circuit 54 is comprised of one differential circuit 104. The latch circuit output, signals "SPN" and "RPN" are the inputs to circuit 104. Circuits 50 and 52 as described above are fully differential circuits wherein their respective inputs and outputs are differential signals. These differential signals "SPN" and "RPN" are converted back into a single ended signal "$V_{OUT}$" by circuit 54. This is essential for ease of design of the following circuitry which processes the signal from the level shifter scheme.

Figure 4:
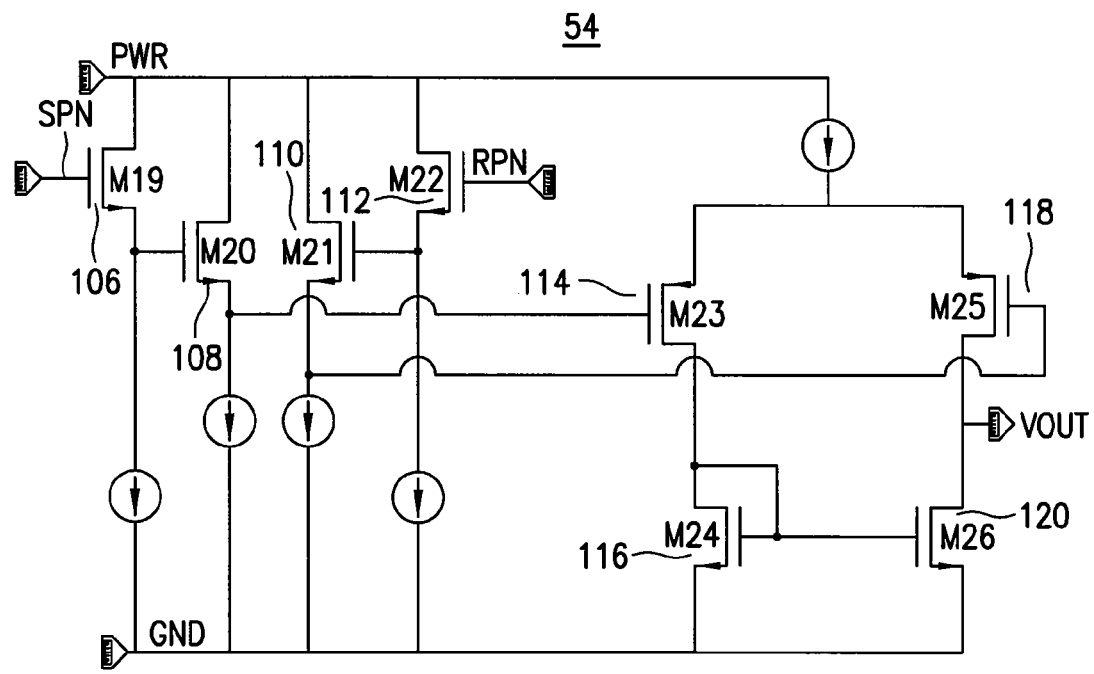
FIG. 4 illustrates the transistor level implementation of the portion of FIG. 1 which performs the differential to single ended output conversion.

A suitable implementation of circuit 54 is illustrated at the transistor level in FIG. 4. Again, other implementations using fully differential topology and NMOS transistors are also within the scope of the invention. As shown, circuit 54 includes transistors 106–120. The differential signals SPN and RPN are converted into a signal that is referenced between Vout and GND, to provide the single ended output.

The differential signals SPN and RPN are connected to source follower transistors 106, 108, 110, and 112 before being connected to the input transistors 114 and 118 of the differential amplifier. The source followers shift down the SPN and RPN signals with respect to $V_{PWR}$ so that they can be used by the differential amplifier formed by transistors 114, 118, 116, and 120. This converts the differential signal at its input to a single ended signal at its output VOUT.

Although the present invention has been described in relation to a particular embodiment thereof, many other variations and modifications and other uses will become apparent to those skilled in the art. It is intended, therefore, that the invention not be limited not by the specific disclosure herein, but that it be given the full scope permitted according to the appended claims.

What is claimed is:

1. A level shifting device having an input side, an output side, and a level shifting circuit connecting the input side and the output side, wherein
    the input side comprises:
        an input circuit operating at a first voltage provided between a first supply bus and a first reference bus, the input circuit is adapted to receive an input signal referenced to the first voltage, and to provide an output;
    the level shifting circuit is connected to the output of the input circuit; and
    the output side operates at a second voltage provided between a second supply bus and a second reference bus, the second buses are separate and independent from the first buses, the output side includes:
        a first circuit having fully differential topology, and
        an output circuit which receives a fully differential input from the first circuit and provides a single-ended output referenced to the second voltage,
        wherein the first circuit is operative to sample signals corresponding to transitions of the input signals between first and second levels, hold signals corresponding to the values of the sampled signals between transitions, and supply the held values in differential form to the output circuit.

2. The level shifting device of claim 1, wherein the output of the input circuit is comprised of
    a first signal corresponding to a transition of the input signal from the first level to the second level,
    a second signal corresponding to a transition of the input signal from the second level to the first level, and
    a third signal corresponding to each transition of the input signal.

3. The level shifting device of claim 2, wherein the level shifting circuit is comprised of a plurality of semiconductor switches, each having a signal path and a control terminal, wherein the output signals from the input circuit are respectively connected to a control terminal of one of the switches, and the signal paths of the switches are coupled between the first reference bus and the second supply bus.

4. The level shifting device of claim 3, further including a common mode transient sensor comprised of an additional semiconductor switch having a signal path and a control terminal, wherein the control terminal is coupled to the first reference bus, and the signal path is coupled between the first reference bus and the second supply bus, the sensor being operative to provide an output representing detection of a common mode transient.

5. The level shifting device of claim 4, wherein the first circuit of the output side includes a portion which is responsive to detection of a common mode transient to prevent a signal representing the arrival of an input signal from passing to the output circuit while the common mode transient is present, but which does permit a signal representing the end the input signal to be passed to the output circuit.

6. The level shifting device of claim 4, wherein the first circuit of the output side includes a portion which is responsive to detection of a common mode transient to prevent a signal representing a transition of the input signal of the first level to the second level from passing to the output circuit while the common mode transient is present, but which does permit a signal representing a transition of the input signal from the second level to the first level to be passed to the output circuit.

7. The level shifting device of claim 1, wherein the output of the input circuit is comprised of
    a first signal corresponding to a transition in a direction from the signal level at the first reference bus to the signal level at the first supply bus,
    a second signal corresponding to a transition of the input signal in a direction from the first supply level to the first reference level, and
    a third signal corresponding to each transition of the input signal, the first, second, and third signals being available at separate output terminals.

8. The level shifting device of claim 7, wherein the level shifting circuit is comprised of a plurality of MOSFETS, each having a gate terminal respectively connected to one of the outputs of the input circuit, and the source-drain signal paths are coupled between the first reference bus and the second supply bus.

9. The level shifting device of claim 8, wherein the MOSFETS are n-channel MOSFETS.

10. The level shifting device of claim 7, further including a common mode transient sensor comprised of an additional MOSFET having a gate terminal coupled to the first reference bus, and the source-drain signal path coupled between the first reference bus and the second supply bus, the sensor being operative to provide an output representing detection of a common mode transient.

11. The level shifting device of claim 1, wherein the first circuit includes a latch circuit having first and second complementary outputs, the latch circuit is operative to hold signals corresponding the sampled values between transitions, and to supply the outputs thereof as inputs to the output circuit.

12. The level shifting device of claim 1, further including a sensing circuit which is operative to detect common mode transients; and wherein a portion of the first circuit on the output side is responsive to detection of a common mode transient to prevent passage of a signal representing an arriving in put signal from passing to the output circuit while the common mode transient is present, but which does permit a signal representing the end of an input signal to be passed to the output circuit.

13. The level shifting device of claim 1, wherein the circuits of the device are comprised of a plurality of transistors, each of which are n-channel MOSFETS.

14. The level shifting device of claim 1, wherein the circuitry thereof is realized as an integrated circuit chip.

* * * * *